United States Patent
Doi et al.

(10) Patent No.: US 6,756,737 B2
(45) Date of Patent: Jun. 29, 2004

(54) PLASMA PROCESSING APPARATUS AND METHOD

(75) Inventors: Akira Doi, Chiyoda-machi (JP); Ken Yoshioka, Hikari (JP); Manabu Edamura, Chiyoda-machi (JP); Hideyuki Kazumi, Hitachi (JP); Saburou Kanai, Hikari (JP); Tsutomu Tetsuka, Chiyoda-machi (JP); Masatsugu Arai, Chiyoda-machi (JP); Kenji Maeda, Matsuda (JP); Tsunehiko Tsubone, Hikari (JP)

(73) Assignee: Hitachi, Ltd., Tokyo (JP)

( * ) Notice: Subject to any disclaimer, the term of this patent is extended or adjusted under 35 U.S.C. 154(b) by 219 days.

(21) Appl. No.: 10/143,790

(22) Filed: May 14, 2002

(65) Prior Publication Data

US 2002/0125828 A1 Sep. 12, 2002

Related U.S. Application Data

(63) Continuation of application No. 09/520,831, filed on Mar. 8, 2000, now Pat. No. 6,388,382.

(30) Foreign Application Priority Data

Mar. 9, 1999 (JP) .............................................. 11-61857

(51) Int. Cl.[7] ........................... H01J 7/24; C23C 14/10; C23C 16/00
(52) U.S. Cl. .............................. 315/111.51; 315/111.21; 204/298.08; 204/298.34; 118/723 I; 118/723 AN; 156/345
(58) Field of Search ....................... 315/111.51, 111.21, 315/111.41, 111.01; 204/298.08, 298.34, 298.16; 118/723 I, 723 AN, 723 IR; 156/345, 345.48

(56) References Cited

U.S. PATENT DOCUMENTS

| | | | |
|---|---|---|---|
| 5,685,941 A | 11/1997 | Forster et al. | 156/345 |
| 5,811,022 A | 9/1998 | Savas et al. | 216/68 |
| 5,817,534 A | 10/1998 | Ye et al. | 438/10 |
| 5,879,575 A | 3/1999 | Tepman et al. | 216/68 |
| 5,907,221 A | 5/1999 | Sato et al. | 315/111.51 |
| 5,964,949 A | 10/1999 | Savas | 118/723 |
| 6,020,686 A | 2/2000 | Ye et al. | 315/111.51 |
| 6,077,384 A | 6/2000 | Collins et al. | 156/345 |
| 6,180,019 B1 | 1/2001 | Kazumi et al. | 216/78 |
| 6,481,370 B2 * | 11/2002 | Kazumi et al. | 118/723 I |

FOREIGN PATENT DOCUMENTS

JP          8-316210          11/1996

* cited by examiner

Primary Examiner—Tuyet T. Vo
(74) Attorney, Agent, or Firm—Antonelli, Terry, Stout & Kraus, LLP (57) ABSTRACT

The main purpose of the present invention is to suppress deposition of byproducts on an inner wall of a vacuum chamber during wafer processing using plasma generated by an inductive coupling antenna and an electrostatic capacitive coupling antenna which are connected in series at a connection point. Deposition of byproducts on the inner wall of the vacuum chamber can be suppressed by grounding the connection point of the inductive coupling antenna and the electrostatic capacitive coupling antenna via a variable-impedance load and varying an impedance of the variable-impedance load, thereby controlling a ratio of plasma produced in the chamber by electrostatic capacitive coupling discharge.

4 Claims, 11 Drawing Sheets

PLASMA PROCESSING APPARATUS AND METHOD

CROSS-REFERENCE TO RELATED APPLICATION

This application is a continuation of application Ser. No. 09/520,831 filed on Mar. 8, 2000, now U.S. Pat. No. 6,388,382, the contents of which are hereby incorporated herein by reference in their entirety.

BACKGROUND OF THE INVENTION

The present invention relates to a plasma processing apparatus and method for supplying high-frequency power to antennas to generate an electric field, causing the electric field to generate a plasma and using the plasma to process specimens.

In a plasma processing apparatus which generates plasma in a vacuum processing chamber by supplying a high-frequency current to a coil-shaped antenna to generate an electric field, causing the electric field to generate a plasma, and using the plasma for processing, if the electric field generated by the coil-shaped antenna is strong, byproducts are hardly deposited on the inner wall of the vacuum chamber by the resulting high-density plasma. On the other hand, if the electric field is weak, the density of the resulting plasma is low, and byproducts are easily deposited on the inner wall of the chamber. Such a deposit is not desirable.

One method of solving this kind of problem has been disclosed in Japanese Non-examined Patent Publication No. 8-316210 (1996). The proposed method comprises the steps of providing a high-frequency antenna which can carry a high frequency current around the outer dielectric wall of a vacuum chamber, providing an electrode which forms a uniform electric field on the inner surface of the dielectric material between this high-frequency antenna and the dielectric member to electrostatically connect the electrode with a plasma, connecting the high-frequency antenna and the electrode in parallel, supplying a small power to the electrode during plasma processing, and supplying a great power to the electrode at a break in the processing to clean the inside of the chamber.

Further, a plasma processing method has been disclosed in U.S. Pat. No. 5,811,022, which comprises the steps of providing a divided Faraday shield between the vacuum chamber and an induction coil to which a high-frequency power is applied, selecting the divided Faraday shield, and controlling the level of a plasma potential change.

The method described in the aforementioned Japanese patent employs a method of individually performing wafer processing and a cleaning process for cleaning the inside of the vacuum chamber. However, this method does not consider the throughput. Further, in this processing method, when a current flowing through an electrostatically capacitance-coupled electrode (or electrostatic capacitive coupling antenna) is made greater in a circuit having the high-frequency antenna and the electrode, which are connected in parallel, to prevent byproducts from being deposited on the inner surface of the vacuum chamber during plasma processing, the high-frequency impedances of the high-frequency antenna (inductive) and the electrode (capacitive) may not be matched. This is because the electrostatically capacitance-coupled electrode, which is provided to produce an electrostatic-coupling discharge in the circuit, works as an electric capacitor, and the high-frequency antenna, which is provided to produce an inductive coupling discharge, works as a coil. Consequently, this circuit forms a parallel resonance (which increases the combined impedance infinitely) and prevents impedance matching. Therefore, plasma processing is not available under conditions which may cause a parallel resonance, which restricts the plasma processing conditions.

Another possible problem of this processing method is that, when a current flowing through an electrostatically capacitance-coupled electrode (or electrostatic capacitive coupling antenna) is made greater to prevent byproducts from being deposited on the inner surface of the vacuum chamber during plasma processing, a great plasma by electrostatic capacitance discharge occurs, which greatly changes the plasma distribution and the uniform wafer processing condition.

In the method described in the aforementioned U.S. patent, the Faraday shield is capacitively coupled with the induction coil. In other words, when the Faraday shield is assumed to be an electrostatically-coupled electrode, the voltage applied to the electrode may be affected by the precision of re-installation of the induction coil and the electrode after the vacuum chamber is opened to the air, since the circuit for supplying a voltage to the electrode uses a floating capacitance. This floating capacitance must be increased to supply a higher voltage to the electrode. For this purpose, it is required to increase the area of the induction coil and bring the induction coil closer to the electrode. This area expansion means provision of a bigger high-voltage section and the shorter distance between the antenna or coil and the electrode may increase the possibility that abnormal discharges will be generated, which reduces the safety and reliability of the equipment. Therefore, it is not preferable to increase the voltage for the electrode so high in a system using a floating capacitance.

Meanwhile, a plasma processing apparatus of the magnetic-field plasma type can control the distribution of plasma by varying the magnetic field which is generated by an electromagnet or the like and is fit for uniform wafer processing with less deposition of byproducts. On the other hand, a plasma processing apparatus of the inductive discharge plasma type using no magnetic field has a limited means to control the plasma distribution. For example, this type of plasma processing apparatus controls the distribution of plasma by changing the shape of the vacuum chamber or adjusting the location of the inductive coupling antenna. Further, any change in a process condition may affect the plasma distribution, and a single plasma processing apparatus can perform processing only under a limited condition.

SUMMARY OF THE INVENTION

An object of the present invention is to provide a plasma processing apparatus and method which can easily control the plasma distribution in plasma processing using an inductive coupling antenna.

Another object of the present invention is to provide a plasma processing apparatus and a method thereof which can suppress deposition of byproducts on the inner wall of the vacuum chamber during plasma processing of a specimen using an inductive coupling antenna.

The aforesaid first problem can be accomplished by using an apparatus comprising an inductive coupling antenna for a wall enclosing a plasma generating area, an electrostatic capacitive coupling antenna at least for a surface which is not equipped with said inductive coupling antenna, which is electrically connected in series with the electrostatic capacitive coupling antenna, and a means for controlling the ratio of high-frequency currents flowing through said electrostatic capacitive coupling antenna and said inductive coupling antenna by controlling the ratio of high-frequency currents flowing through the inductive coupling antenna and the electrostatic capacitive coupling antenna, which are electrically connected in series, generating a plasma in the vacuum chamber with the electric field using said inductive coupling antenna and the electrostatic capacitive coupling antenna, and using said plasma to process a specimen.

The aforesaid second problem can be accomplished by using an apparatus comprising an inductive coupling antenna for a wall enclosing a plasma generating area, an electrostatic capacitive coupling antenna for a surface which is not equipped with said inductive coupling antenna, which is electrically connected in series with the electrostatic capacitive coupling antenna, and by generating an electric field using the inductive coupling antenna and the electrostatic capacitive coupling antenna, which are electrically connected in series, adding an electric field produced by the inductive coupling antenna to an area which has a very weak electric field, generating a plasma in the vacuum chamber by these electric fields, and using said plasma to process a specimen.

The plasma processing apparatus of the present invention can control the ratio of high-frequency currents flowing through inductive coupling and electrostatic capacitive coupling antennas which are electrically, connected in series to adjust the magnitudes of electric fields produced by said antennas. The present invention has an effect of enabling production of an optimum plasma in the vacuum chamber and suppressing deposition of byproducts on the inner wall of the vacuum chamber during plasma processing of wafers by inductive coupling antennas.

DETAILED DESCRIPTION OF THE INVENTION

A first embodiment of the present invention will be described in detail with reference to FIG. 1 through FIG. 3.

Figure 1:
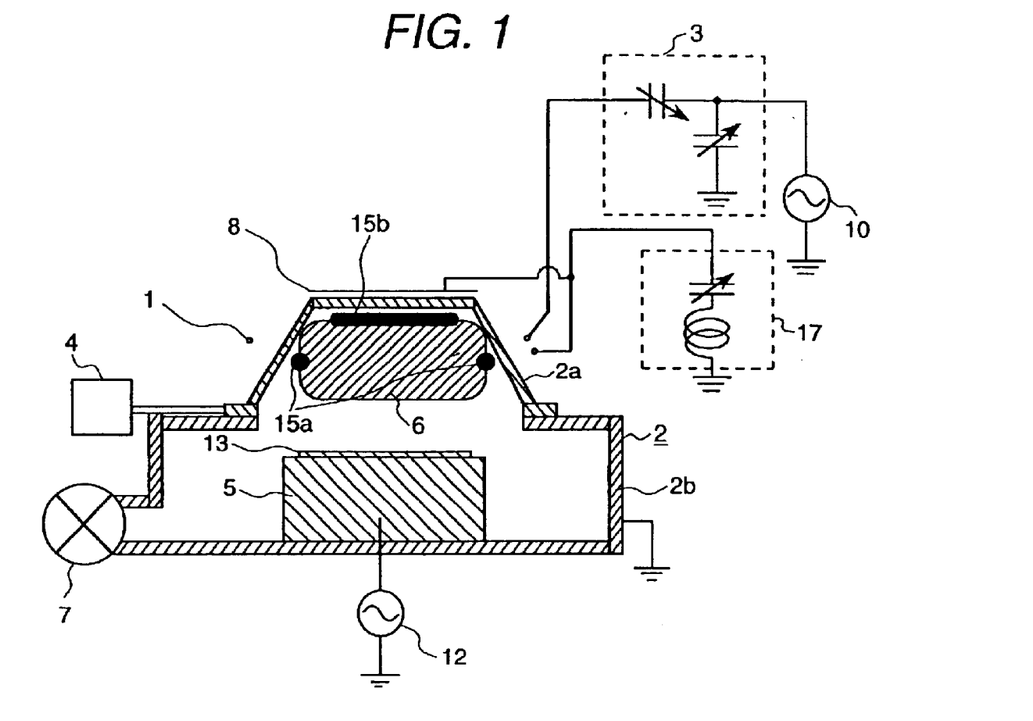
FIG. 1 is a sectional view of a plasma processing apparatus which represents a first preferred embodiment of the present invention.

FIG. 1 is a sectional view of a plasma processing apparatus which represents the first preferred embodiment of the present invention. The vacuum chamber 2 consists of a discharging section 2a made of an insulating material (or non-conductive material such as silica or ceramic) forming a plasma generating space in the section and a processing section 2b equipped with an electrode 5 on which a specimen to be processed, such as a wafer 13, is placed. The processing section 2b is grounded and the electrode 5 is insulated from the processing section 2b by a proper insulating material. A coil-like inductive coupling antenna 1 is wound around the discharging section 2a. Above the discharging section 2a there is placed a disk-shaped electrostatic capacitive coupling antenna 8 which couples with plasma 6 electrostatically. The inductive coupling antenna 1 and the electrostatic capacitive coupling antenna 8 are connected in series with a primary high-frequency power source 10 via an impedance matching box 3. A load 17, having a variable impedance, is grounded in parallel with the electrostatic capacitive coupling antenna 8. A processing gas is supplied from a gas supplying unit 4 into the vacuum chamber 2. The atmosphere in the vacuum chamber 2 is evacuated to provide a predetermined gas pressure by a vacuum unit 7. A secondary high-frequency power source 12 is connected to the electrode 5.

In this plasma processing apparatus, a process gas supplied from the gas supplying unit 4 into the vacuum chamber is highly ionized (into plasma) by electric fields generated by the inductive coupling antenna 1 and the electrostatic capacitive coupling antenna 8. The ionized (or plasma) gas is exhausted later by the vacuum unit 7. A high-frequency power in a HF band (e.g. 13.56 MHz, 27.12 MHz, and 40.68 MHz) or in a higher frequency band, such as a VHF band, is supplied to the inductive coupling antenna 1 and the electrostatic capacitive coupling antenna 8 to produce electric fields for plasma. To suppress an unwanted power reflection, the impedance matching box 3 is provided to match the impedances of the antennas with the output impedance of the primary high-frequency power source 10. For this purpose, the impedance matching box 3 uses two general inverted-L-type variable capacitors having variable electrostatic capacitances. The wafer 13 to be processed is placed on the electrode 5. The secondary high-frequency power source 12 supplies a biasing voltage to the electrode 5 to attract ions in plasma 6 towards the wafer 13.

Figure 2:
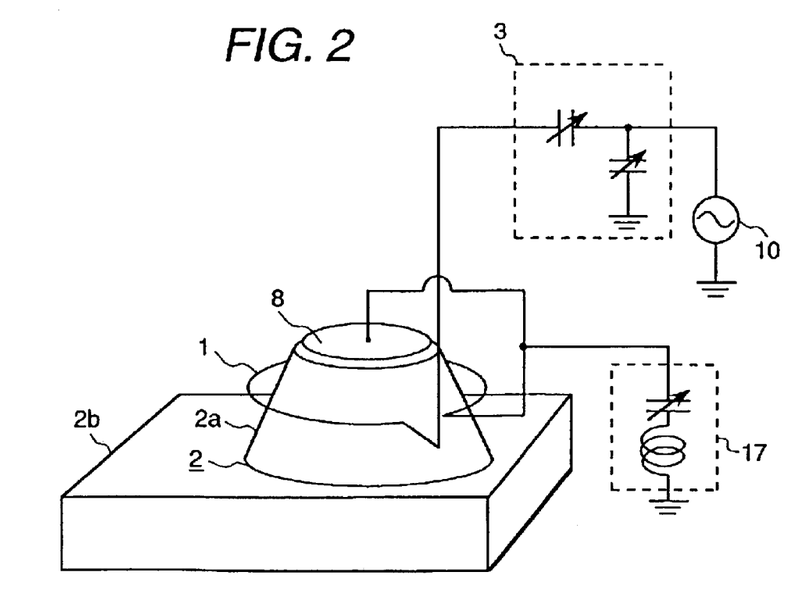
FIG. 2 is a perspective view of the discharging circuit of the plasma processing apparatus of FIG. 1.

FIG. 2 is a perspective view of the plasma processing apparatus of FIG. 1 to show the discharging circuit. In this discharging circuit, the high-frequency current from the primary high-frequency power source 10 flows through the matching box 3, the inductive coupling antenna 1, and the electrostatic capacitive coupling antenna 8 in that order. The current coming from the electrostatic capacitive coupling antenna flows to the ground via the plasma. The load 17 having a variable impedance is grounded in parallel with the electrostatic capacitive coupling antenna 8. The load 17 having a series connection of a variable capacitor and a fixed inductor can reduce the impedance to 0 by resonating in series.

Figure 3:
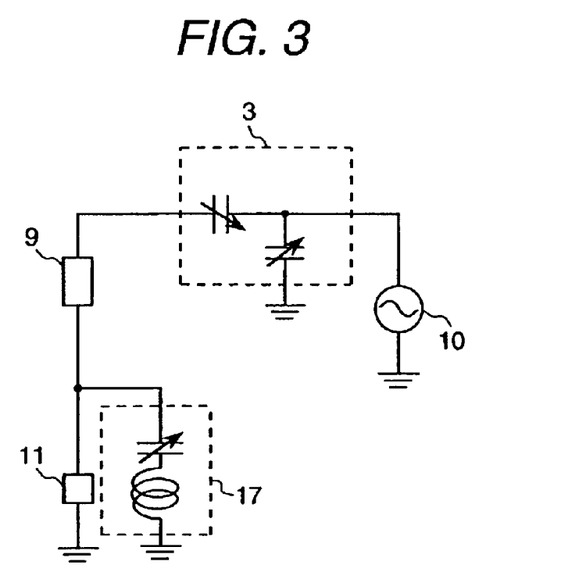
FIG. 3 is an equivalent circuit diagram of the discharging circuit of FIG. 2.

FIG. 3 shows a circuit equivalent to the discharging circuit of FIG. 2. This circuit has the inductive coupling antenna 1 as load 9 and the electrostatic capacitive coupling antenna 8 as load 11.

When the impedance of the load 17 is 0, the voltage across the load 11 is 0 and, consequently, a current flowing through the electrostatic capacitive coupling antenna 8 becomes 0, which suppresses the electrostatic capacitive coupling discharge. In other words, plasma is generated only by the inductive coupling discharge. As the impedance of the load 17 increases, the current flowing through the load 11 increases. Consequently, the ratio of plasma generated by the electrostatic capacitive coupling discharge becomes greater.

In this case, the impedance of the load 11 must be varied in the matching range of the impedance matching box. The following conditions must be satisfied to match impedances.

One of the matching conditions will be explained by way of example. Let's assume that the loads 9, 11, and 17, respectively, have reactances YL, YC, and YV (in that order). The reactance YL is greater than 0 as it is inductive and the reactance YC is less than 0 as it is capacitive. However, since the loads 11 and 17 are connected in parallel, if the reactance YC is equal to the negative value of the reactance YV, while the reactance YV is positive, this circuit causes a parallel resonance, which drastically increases the combined impedance and prevents impedance matching. As a result, plasma cannot be produced. To enable impedance matching, it is necessary to vary the load 11 while the reactance YV is negative.

Another matching condition will be explained as another example. Let's assume that the reactance of the combined impedance of the loads 11 and 17, which are connected in series, is YG. The reactance YG is negative (less than 0) when both reactances YV and YC are negative. However, when the reactance YG is greater than YL, the reactance of the load of the whole circuit to be matched becomes negative. As a result, the inverted-L-type matching box may be disabled. In this case, impedance matching is enabled when an inductor is connected in series with the load 9. Although the use of a π-type matching box is also effective, the matching box has a complicated structure.

As explained above, it is possible to change the ratio of a high-frequency current which flows through the inductive coupling antenna 1 and the electrostatic capacitive coupling antenna 8 by changing the impedance of the load 17. This can change the magnitude of an electric field produced by the respective antennas. In other words, it is possible to change the plasma density produced by respective electric fields according to the location of each antenna and thus control the distribution of plasma in the discharging section 2a.

Namely, the inductive coupling antenna 1 produces stronger plasma in the outer areas 15a and the electrostatic capacitive coupling antenna 8 produces a stronger plasma in the center area 15b, as seen in FIG. 1. Therefore, the density of the plasma in the center can be controlled by regulating the current flowing through the electrostatic capacitive coupling antenna 8. This enables adequate control of the plasma distribution and uniform wafer processing.

Further, the electron temperature of the plasma produced by electrostatic capacitive coupling discharge is apt to be higher than that of plasma produced by the inductive coupling discharge. Accordingly, by regulating the ratio of the current flowing through the electrostatic capacitive coupling antenna 8, it is possible to control the ratio of electrostatic capacitive coupling discharge relative to the inductive coupling discharge. Namely, it is possible to control the electron temperature of the plasma and the ionization of the process gas and select optimum processing conditions (e.g. fit for metal etching, gate etching, insulator etching, magnetic head etching, and so on).

The inductive coupling antenna 1 produces a stronger electric field in the area 15a near the inductive coupling antenna. Therefore, when the inductive coupling antenna 1 produces a plasma, more byproducts are deposited on the ceiling of the discharging section 2a than on the side walls of the discharging section 2a in the vacuum chamber 2. To suppress deposition of byproducts, a disk-like electrostatic capacitive coupling antenna 8, which electrostatically couples with the plasma, is provided over the ceiling of the discharging section 2a to produce a strong electric field in the area 15b near the ceiling. This suppresses or prevents deposition of byproducts on the ceiling of the discharging section 2a.

As described above, in accordance with the first embodiment of the present invention, a strong electric field produced by the electrostatic capacitive coupling antenna can be formed in an area where the electric field produced by the inductive coupling antenna is weak by providing an inductive coupling antenna around the discharging section and an electrostatic capacitive coupling antenna over a surface of the discharging section where the inductive coupling antenna is not located, electrically connecting the inductive coupling antenna and the electrostatic capacitive coupling antenna in series, and supplying high-frequency power to the antennas. This embodiment has an effect of suppressing the deposition of byproducts on the inner wall of the vacuum chamber even while wafer processing by plasma is in progress.

Further, by regulating the ratio of currents flowing through the inductive coupling antenna and the electrostatic capacitive coupling antenna, the density of the plasma in the central processing area can be controlled, which enables optimum control of the plasma distribution and uniform wafer processing.

Similarly, the ratio of the electrostatic capacitive coupling discharge to the inductive coupling discharge can be controlled by regulating the ratio of currents flowing through the inductive coupling antenna and the electrostatic capacitive coupling antenna, for example, by controlling the current which flows through the electrostatic capacitive coupling antenna. This enables control of the electron temperature of the plasma and the ionization of the process gas.

Figure 4:
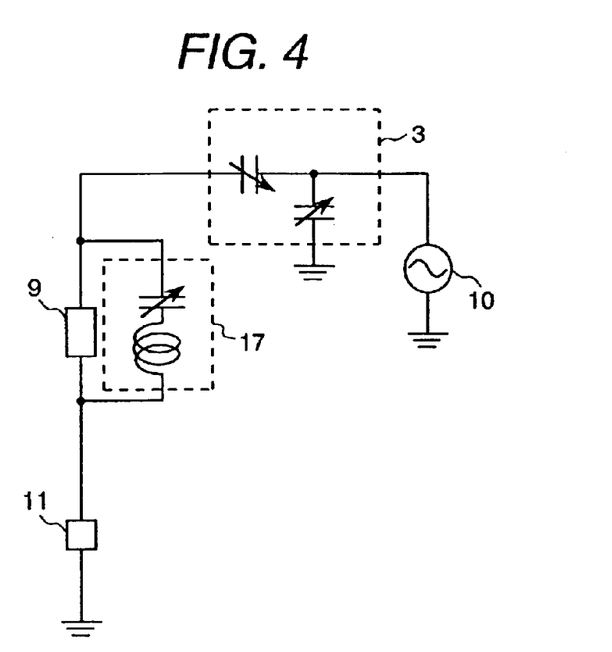
FIG. 4 is a diagram of another embodiment of the equivalent circuit of FIG. 3.

Although the first embodiment of the present invention employs a method of controlling the current which flows through the electrostatic capacitive coupling antenna using a load 17 as one of the methods of regulating the ratio of currents flowing through the inductive coupling antenna and the electrostatic capacitive coupling antenna, it is also effective to connect the load 17 in parallel with the inductive coupling antenna 1. FIG. 4 shows the equivalent circuit thereof. When the impedance of the load 17 is 0, the high-frequency current flowing through the load 9 of the inductive coupling antenna 1 becomes 0. This current becomes greater as the impedance of the load 17 becomes greater. As explained above, this circuit can control the current which passes through the inductive coupling antenna 1.

Figure 5:
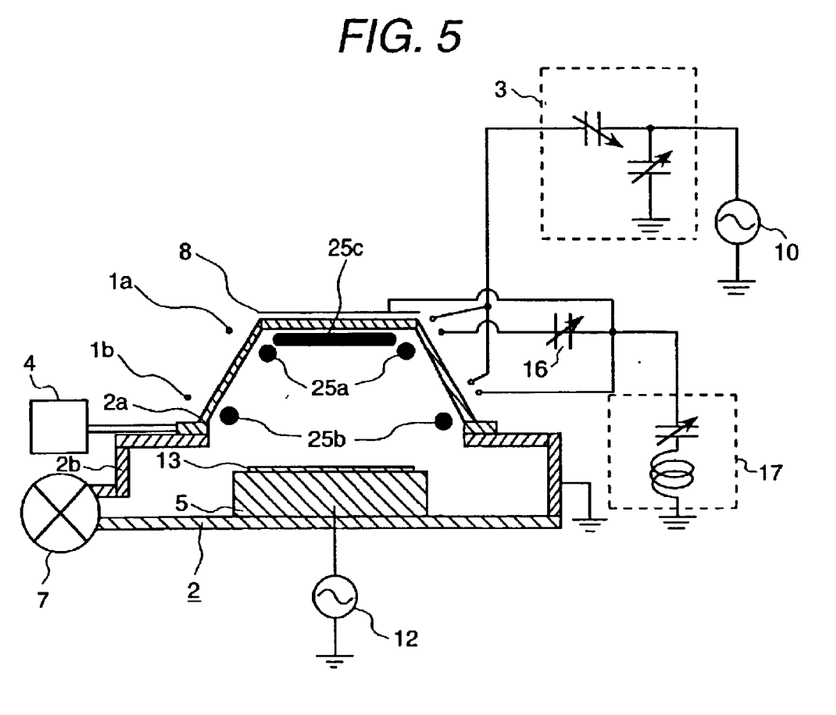
FIG. 5 is a sectional view of a plasma processing apparatus which represents a second preferred embodiment of the present invention.
Figure 6:
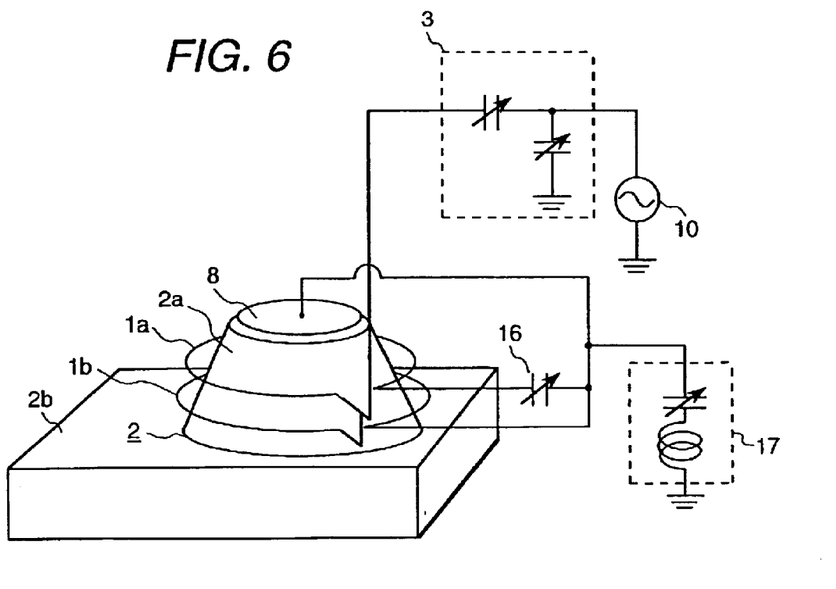
FIG. 6 is a perspective view of the discharging circuit of the plasma processing apparatus of FIG. 5.

A second embodiment of the present invention will be described in detail below with reference to FIG. 5 through FIG. 8. FIG. 6 is a perspective view of the discharging circuit. Symbols in FIG. 5 and FIG. 6 identify the same members as those in FIG. 1 and FIG. 2. Their explanation is omitted here. FIG. 5 and FIG. 6 are different from FIG. 1 and FIG. 2 in that this embodiment has two upper and lower inductive coupling antennas 1a and 1b which are connected in parallel and that a variable capacitor 16 is connected in series with the inductive coupling antenna 1a.

The plasma processing apparatus of this embodiment can control the plasma distribution by regulating the magnitudes of high-frequency currents which pass through the upper and lower inductive coupling antennas. How the plasma distribution is controlled will be explained.

For this explanation, it is assumed that the upper and lower inductive coupling antennas 1a and 1b produce strong electric fields respectively in areas 25a and 25b, and that the electrostatic capacitive coupling antenna 8 produces a strong electric field in the area 25c. Plasma is generated in these strong electric fields. The discharging section of the vacuum chamber 2 is tapered towards the top. In this embodiment, the area 25a has a smaller diameter than the area 25b. Consequently, plasma produced by the inductive coupling antenna 1a is the strongest in the center and plasma produced by the inductive coupling antenna 1b is the strongest in the outer periphery. Therefore, the distribution of plasma can be controlled by regulating the ratio of currents flowing through the inductive coupling antennas 1a and 1b.

A method of regulating the ratio of currents flowing through the inductive coupling antennas 1a and 1b will be explained with reference to FIG. 7, which shows the equivalent circuit of the discharging circuit of FIG. 6. This circuit represents the inductive coupling antenna 1a as load 9a and the inductive coupling antenna 1b as load 9b. Let's assume that the combined impedance of the load 9a and the variable capacitor 16 is Za and the impedance of the load 9b is Zb. The magnitudes of high-frequency current flowing through the loads 9a and 9b are respectively proportional to 1/Za and 1/Zb. Although the inductive coupling antenna 1a has a positive reactance, the current can be controlled by changing the impedance Za from a positive value to 0 using the variable capacitor 16 having a negative reactance.

If the reactance Za becomes negative, impedance matching may be disabled as the reactance Zb is positive. To enable impedance matching, it is recommended to keep the reactance Za positive. Therefore, the circuit of FIG. 7 is able to increase the current flowing through the load 9a.

In wafer processing by the aforesaid processing method and apparatus, when the high-frequency current for the electrostatic capacitive coupling antenna 8 is made greater and the ratio of currents for the inductive coupling antennas 1a and 1b is made constant, plasma in the area 25c becomes greater and the current flowing through the inductive coupling antennas 1a and 1b go lower relatively. As a result, less plasma is generated in areas 25a and 25b. Consequently, the plasma becomes highest in density in the center and the wafer processing speed is also highest in the center.

The plasma distribution and wafer processing speed can be made uniform by reducing the current for the inductive coupling antenna 1a, increasing the current for inductive coupling antenna 1b, and thus producing more plasma in the bigger area 25b and less plasma in the smaller area 25a.

As aforesaid, in addition to the effect described in the first embodiment, the second embodiment also has an effect of finely controlling the distribution of plasma in the discharging section because the plasma processing apparatus of the second embodiment has two inductive coupling antennas of different sizes to which variable quantities of high-frequency power are supplied to produce inductive coupling discharges of different magnitudes.

Further, as this embodiment can respectively control high-frequency currents which flow through two inductive coupling antennas 1a and 1b and the electrostatic capacitive coupling antenna 8, this embodiment can cause the antennas to produce strong electric fields in areas 25a, 25b, and 25c to produce the optimum plasma status, which can finely suppress deposition of byproducts on the walls of the vacuum chamber while plasma processing is in progress.

Figure 7:
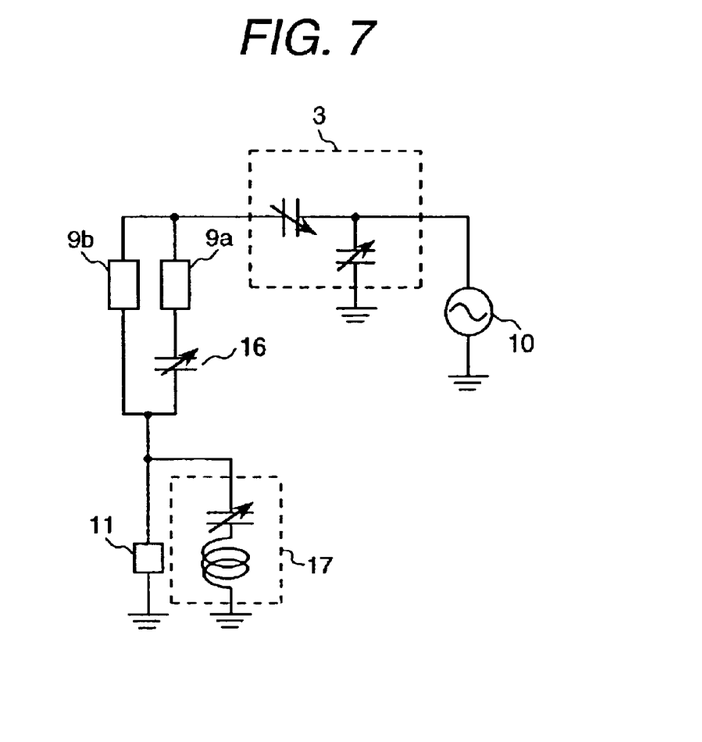
FIG. 7 is an equivalent circuit diagram of the discharging circuit of FIG. 6.

To reduce the current for the load 9a in the second embodiment, the variable capacitor 16 in the circuit of FIG. 7 must be connected in series with the load 9b (instead of connecting it in series with the load 9a).

Figure 8:
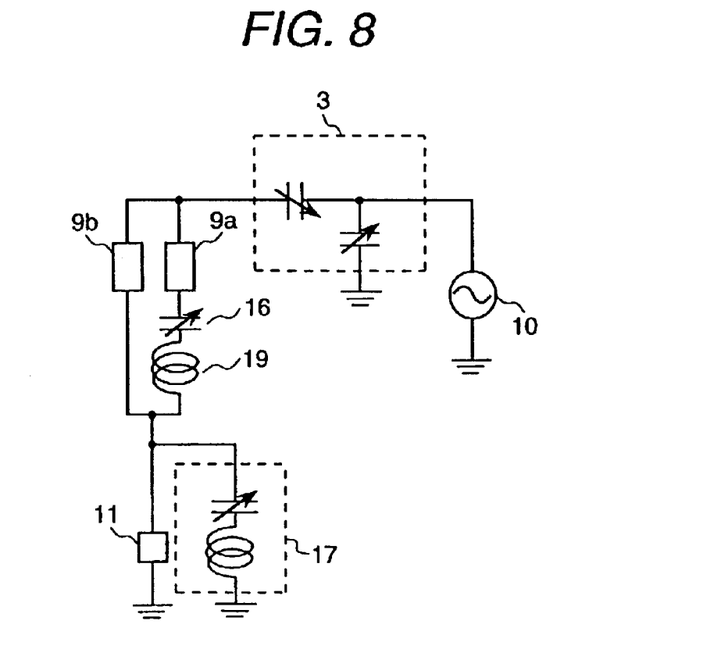
FIG. 8 is a diagram of another embodiment of the equivalent circuit of FIG. 6.

As another circuit to reduce the current flowing through the load 9a, an inductor 19 can be connected in series with the variable capacitor 16, as shown in the equivalent circuit of FIG. 8. In this circuit, the reactances of loads 9a and 9b are positive, while the reactance of the combined impedance of the variable capacitor 16 and the inductor 19 are positive. With this, impedance matching can be carried out without causing any parallel resonance.

Figure 9:
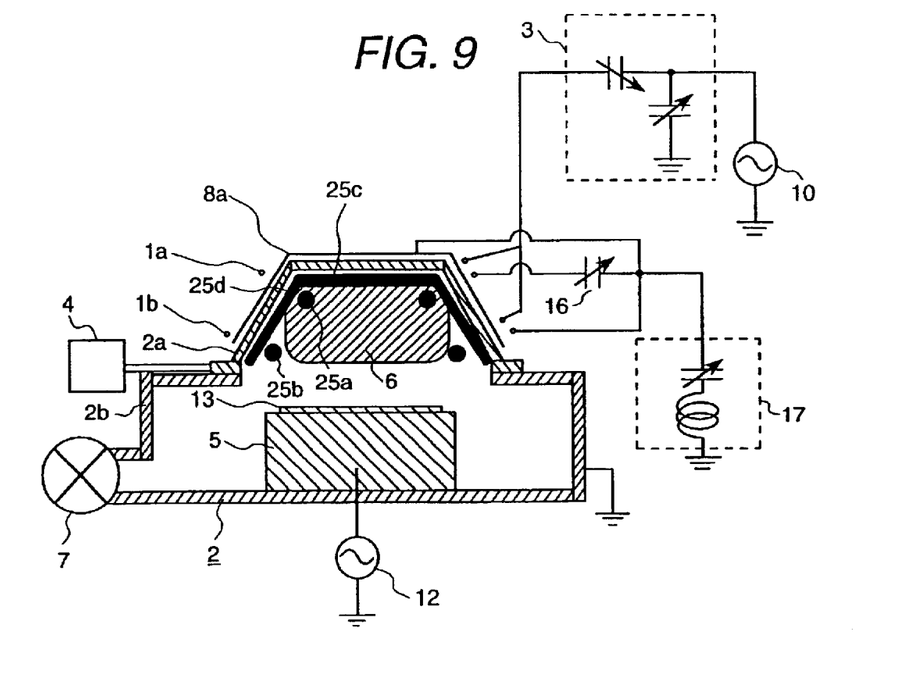
FIG. 9 is a sectional view of a plasma processing apparatus which represents a third preferred embodiment of the present invention.
Figure 10:
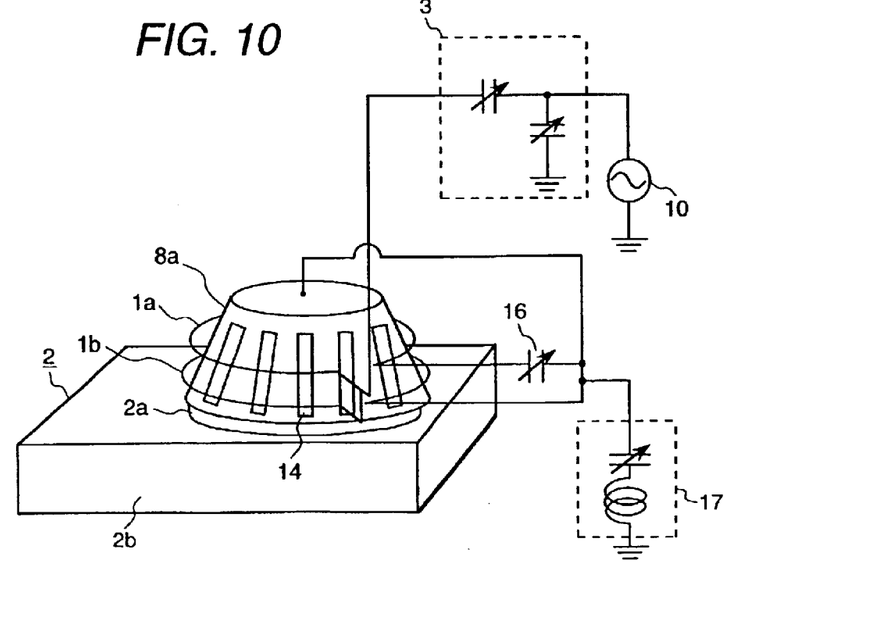
FIG. 10 is a perspective view of the discharging circuit of the plasma processing apparatus of FIG. 9.

A third embodiment of the present invention will be described in detail with reference to FIG. 9 and FIG. 10. FIG. 9 shows a sectional view of the plasma processing apparatus in accordance with the present invention and FIG. 10 is a perspective view of the discharging circuit. Symbols in FIG. 9 and FIG. 10 denote the same members as those in FIG. 5 and FIG. 6. Their explanation is omitted here. FIG. 9 and FIG. 10 are different from FIG. 5 and FIG. 6 in that the electrostatic capacitive coupling antenna 8a of this embodiment covers the whole discharging section 2a of the vacuum chamber 2.

For this explanation, it is assumed that the upper and lower inductive coupling antennas 1a and 1b produce strong electric fields respectively in areas 25a and 25b and that the electrostatic capacitive coupling antenna 8a produces a strong electric field in the area 25d. Plasma is generated in these strong electric fields. Since the electrostatic capacitive coupling antenna 8a is provided to cover the whole discharging section 2a of the vacuum chamber 2, the area 25d comprises an area adjoining the whole inner wall of the discharging section 2a of the vacuum chamber 2. The electrostatic capacitive coupling discharge in this area can suppress the deposition of byproducts on the whole inner wall of the discharging section 2a or clean this area. The portion of the electrostatic capacitive coupling antenna 8a provided between the inductive coupling antennas 1a and 1b and the discharging section 2a prevents an electrostatic capacitive coupling electric field produced by the inductive coupling antennas 1a and 1b and the plasma from propagating into the discharging section 2a and thus prevents the inner walls of the discharging section 2a from being eroded away. Namely, it works as a Faraday shield.

FIG. 10 is a perspective view of the discharging circuit of the plasma processing apparatus of FIG. 9. The electrostatic capacitive coupling antenna 8a has slits 14 which intersect the inductive coupling antennas 1a and 1b at right angles so that the electric fields produced by the inductive coupling antennas 1a and 1b may pass into the discharging section 2a. The angle of intersection need not be a right angle so long as the slits do not block the electric fields produced by the inductive coupling antennas 1a and 1b.

As aforesaid, in addition to the effects described in the first and second embodiments, the third embodiment also has an effect of suppressing or preventing the deposition of byproducts on the whole inner wall of the discharging section 2a because the electrostatic capacitive coupling antenna 8a is provided to cover the whole discharging section 2a.

Figure 11:
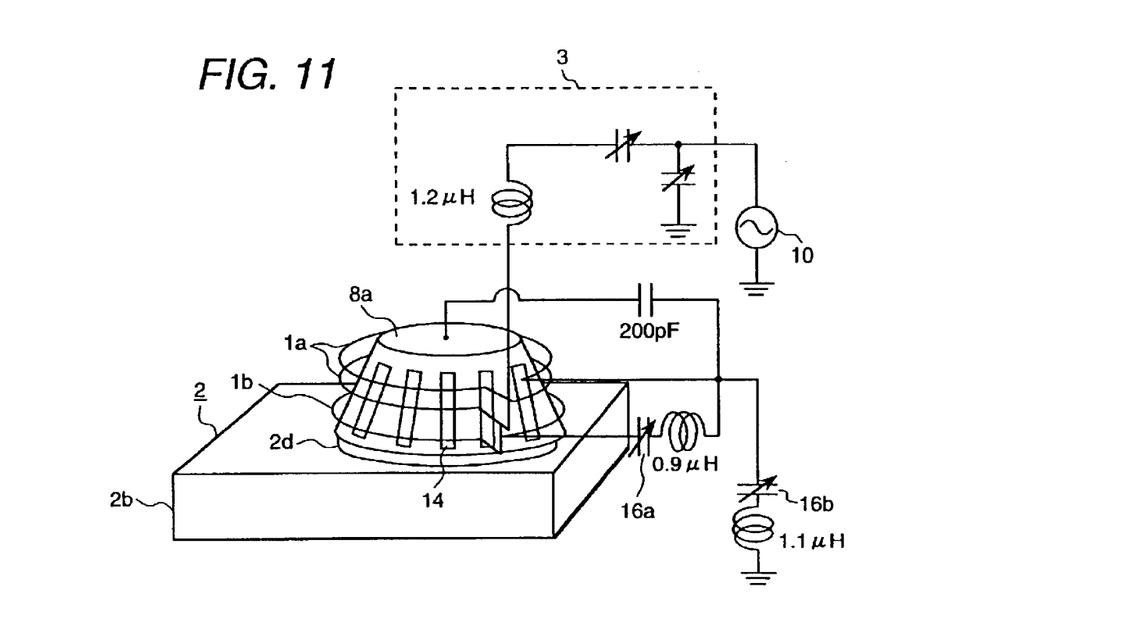
FIG. 11 is a perspective view of the discharging circuit for an experimental plasma processing apparatus using the concept of the third embodiment of the present invention.

The result of an experiment which uses the concept of the third embodiment of the present invention to produce plasma will be explained with reference to FIG. 11, which shows a discharging circuit used for the experiment. This discharging circuit contains a 1.2 μH inductor in the matching box for easier impedance matching. This circuit also has a 200 pF capacitor connected to the electrostatic capacitive coupling antenna 8a to suppress a current flowing through the electrostatic capacitive coupling antenna 8a. The inductive coupling antenna 1a has two turns and the inductive coupling antenna 1b has one turn. Currents for the two inductive coupling antennas 1a and 1b and the electrostatic capacitive coupling antenna 8a are each controlled by a load comprising a variable capacitor (16a and 16b) and a fixed inductor.

Figure 12:
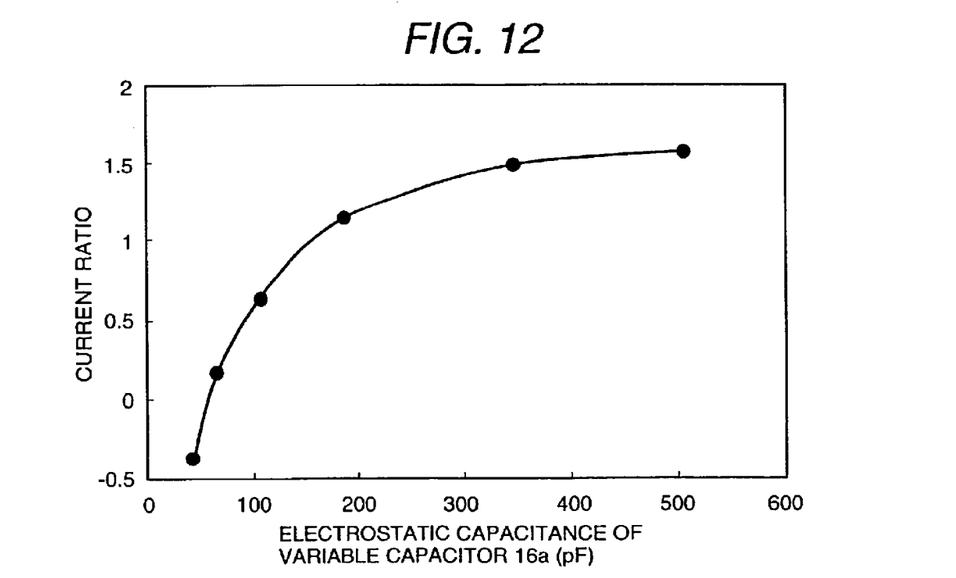
FIG. 12 is a graph which shows the result of an experiment using the apparatus of FIG. 11.

FIG. 12 shows a change of the ratio of a current flowing through the inductive coupling antenna 1a to a current flowing through the inductive coupling antenna 1b as the electrostatic capacitance of the variable capacitor 16a changes. As seen from this drawing, it is apparent that the ratio of currents flowing through the antennas 1a and 1b can be controlled by the variable capacitor 16a. In this circuit, a series connection of the variable capacitor 16a and a 0.9 μH inductor is connected to the end of the antenna 1b. When the variable capacitor 16a is controlled to make the combined impedance of the variable capacitor 16a, the 0.9 μH inductor, and the antenna 1b have a value of 0, the high-frequency current flows through the antenna 1b only and the current ratio is 0. If the impedance is greater than 0, the currents flowing through the antennas 1a and 1b have an identical phase and the current ratio is positive. On the other hand, if the impedance is smaller than 0, the currents flowing through the antennas 1a and 1b have different phases and the current ratio is negative.

Figure 13:
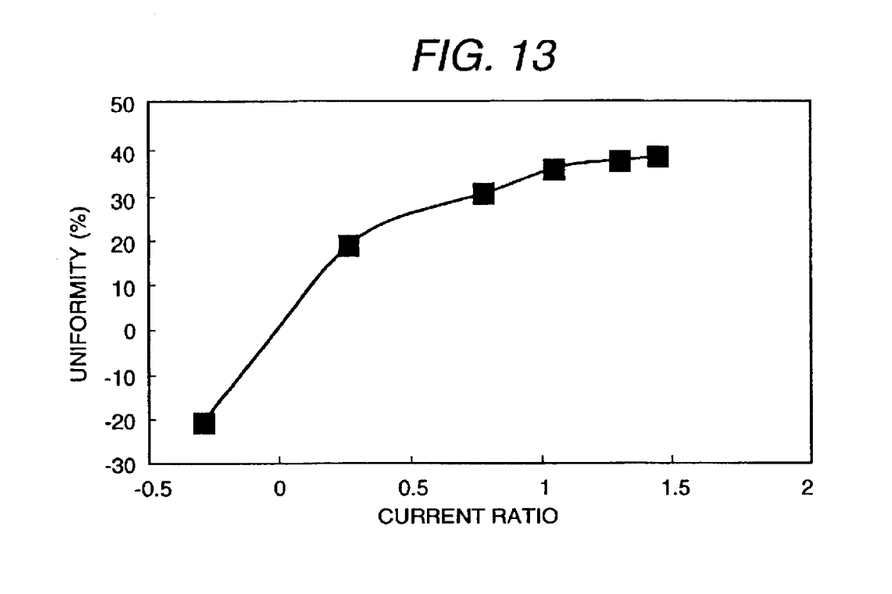
FIG. 13 is a graph which shows the result of an experiment using the apparatus of FIG. 11.

FIG. 13 shows the uniformity in the density of plasma ion saturated current on the electrode 5 when the current ratio is varied. A positive uniformity means that the plasma density is high in the center and a negative uniformity means that the plasma density is high in the periphery. By controlling the current ratio, the plasma ion saturated current density can be controlled to be even in the whole area (from center to periphery). The experimental equipment shown in FIG. 11 can control the uniformity of the plasma ion saturated current density by 50%.

Figure 14:
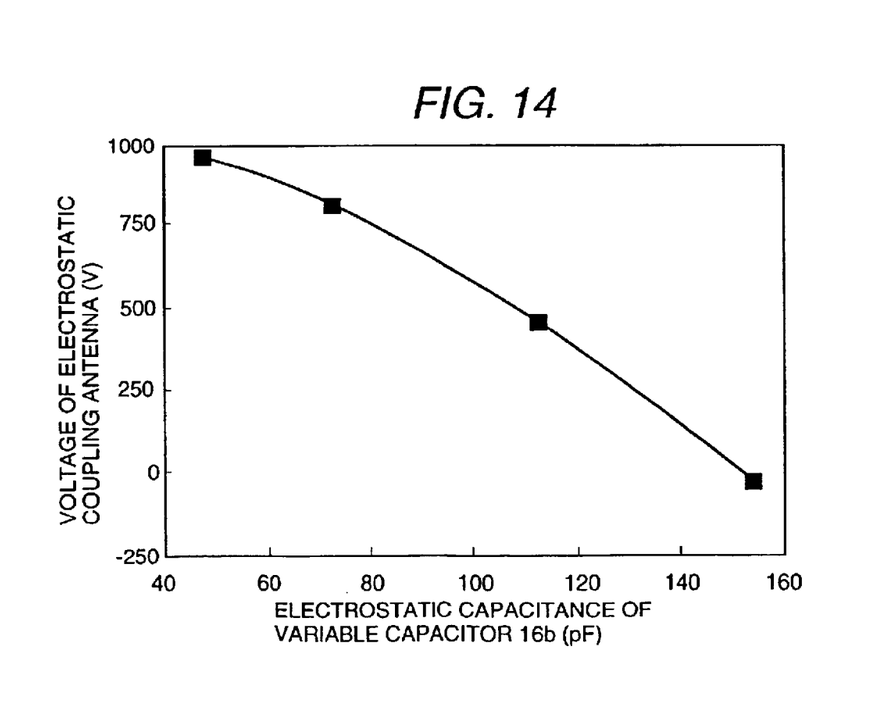
FIG. 14 is a graph which shows the result of an experiment using the apparatus of FIG. 11.

FIG. 14 shows the amplitude (peak-to-peak) of a voltage which is generated in the electrostatic capacitive coupling antenna 8a when the electrostatic capacitance of the variable capacitor 16b is varied. As can be seen, the use of a discharging circuit comprising a series connection of an inductive antenna and an electrostatic capacitive coupling antenna can control the voltage on the electrostatic capacitive coupling antenna 8a in a wider range than the conventional circuit using the floating capacitance (0 to a maximum of about 1000 V).

Although the third embodiment of the present invention uses two inductive coupling antennas, the plasma processing apparatus can have three or more inductive coupling antennas to control the plasma distribution with a higher precision.

Figure 15:
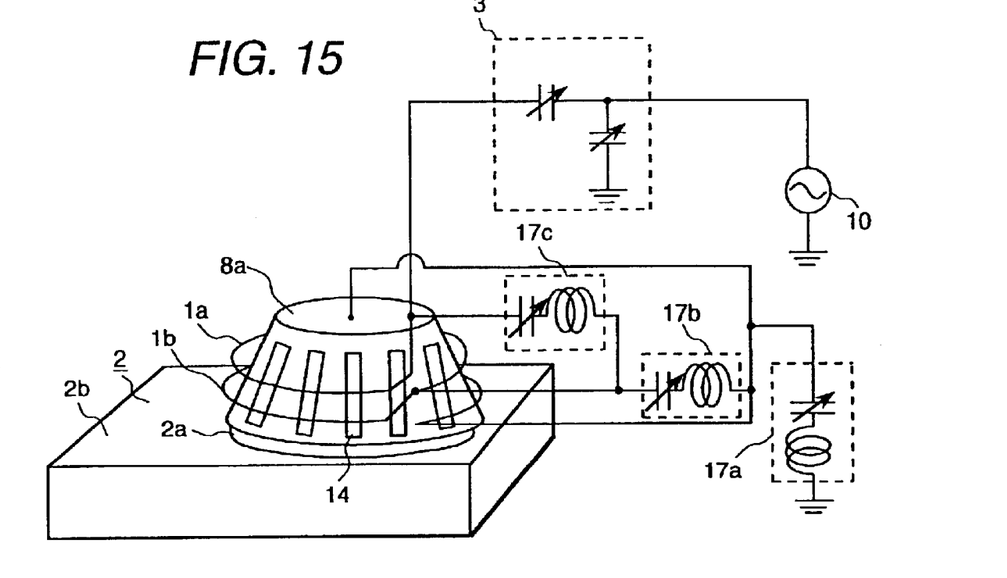
FIG. 15 is a perspective view of a plasma processing apparatus which represents a fourth preferred embodiment of the present invention.

A fourth embodiment of the present invention will be described in detail with reference to FIG. 15 and FIG. 16. FIG. 15 is a perspective view of the plasma processing apparatus. Symbols in FIG. 15 denote the same members as those in FIG. 10. Their explanation is omitted here. FIG. 10 and FIG. 15 are different from each other in that the inductive coupling antennas 1a and 1b are connected differently in the discharging circuit. Namely, in this discharging circuit, the electrostatic capacitive coupling antenna 8a is connected in series with a series connection of the inductive coupling antennas 1a and 1b. To control the current which flows through the electrostatic capacitive coupling antenna 8a, a variable-impedance load 17a is connected in parallel with the electrostatic capacitive coupling antenna 8a. Further, to control the currents which flow through the inductive coupling antennas 1a and 1b, loads 17b and 17c are connected in series.

Figure 16:
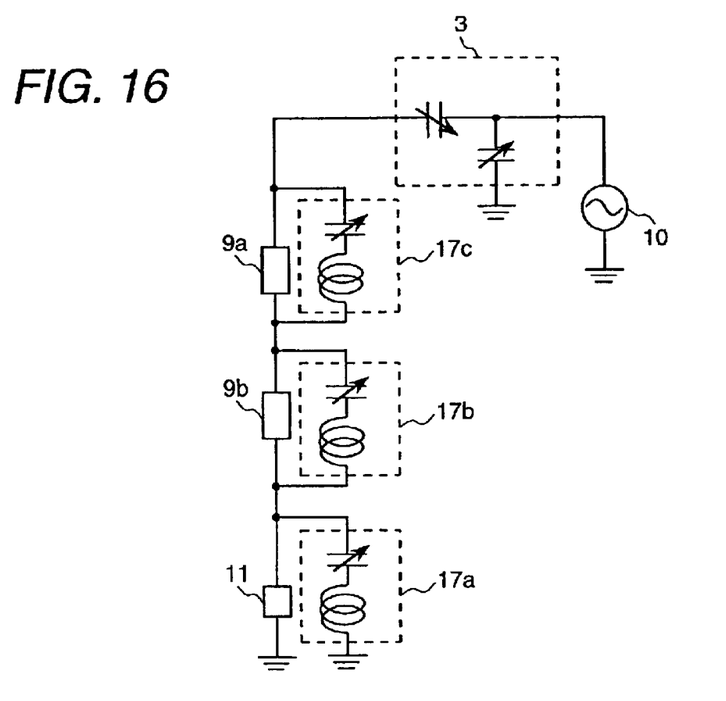
FIG. 16 is an equivalent circuit diagram of the discharging circuit of FIG. 15.

FIG. 16 shows an equivalent circuit of the discharging circuit of the plasma processing apparatus of FIG. 15. This circuit represents the inductive coupling antennas 1a and 1b as load 9a and load 9b, respectively, and the electrostatic capacitive coupling antenna 8a as load 11. In this embodiment, the magnitude of the inductive coupling discharge is controlled by the magnitude of the load 17a. As the impedance of the load 17a increases, the current flowing through the load 11 increases and, consequently, the plasma produced by electrostatic capacitive coupling discharge becomes greater. Similarly, as the impedance of the load 17b or 17c increases, the inductive coupling discharge produced by the inductive coupling antenna 1a or 1b becomes greater. Therefore, the same effects as those of the first through third embodiments can be obtained by controlling the impedances of loads 17a, 17b, and 17c.

Although the fourth embodiment of the present invention has loads 17a, 17b, and 17c, which are respectively connected in parallel with the inductive coupling antennas 1a and 1b and the electrostatic capacitive coupling antenna 8a, one of the loads 17a, 17b, and 17c can be omitted for the same control effect.

For impedance matching, it is preferable that the reactance of the load 17a should be negative to avoid parallel resonance, because the reactance of the impedance of the electrostatic capacitive coupling antenna 8a is negative.

Similarly, it is preferable that the reactances of loads 17b and 17c should be positive to avoid parallel resonance, because the reactances of the impedances of the inductive coupling antennas 1a and 1b are positive.

If the reactance of the load of the discharging circuit to be impedance-matched is negative and the inverted-L-type matching box 3 is disabled, an inductor should be inserted in series between the matching box 3 and the discharging circuit to enable impedance matching.

Figure 17:
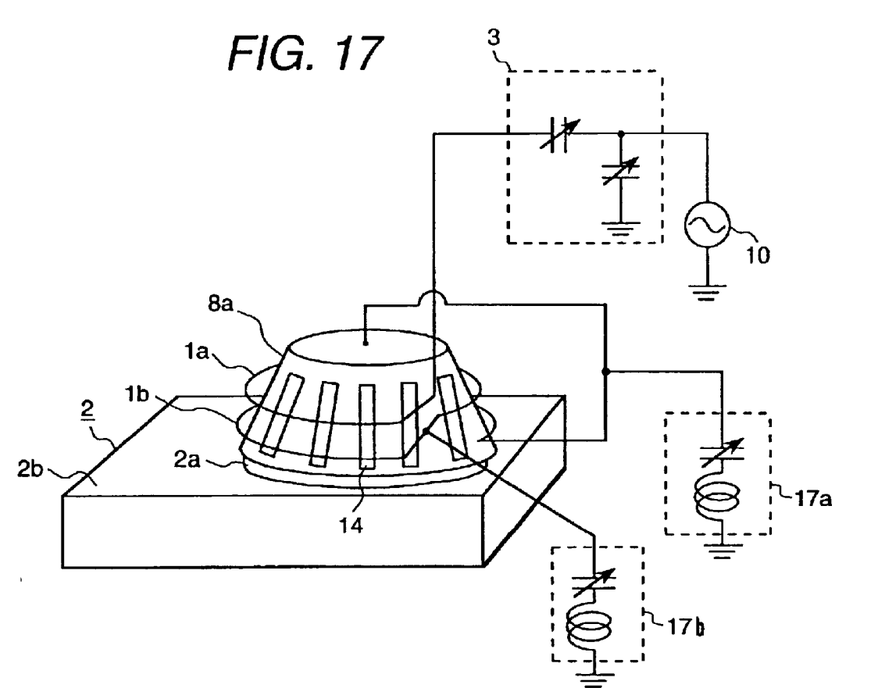
FIG. 17 is a perspective view of a plasma processing apparatus which represents a fifth preferred embodiment of the present invention.

A fifth embodiment of the present invention will be described in detail with reference to FIG. 17 and FIG. 18. FIG. 17 is a perspective view of the plasma processing apparatus of the present invention. Symbols in FIG. 17 denote the same members as those in FIG. 15. Their explanation is omitted here. FIG. 17 and FIG. 15 are different from each other in that the inductive coupling antennas are connected differently in the discharging circuit. Namely, in this discharging circuit, the electrostatic capacitive coupling antenna 8a is connected in series with a series connection of the inductive coupling antennas 1a and 1b. To control the current which flows through the electrostatic capacitive coupling antenna 8a, a variable-impedance load 17a is connected in parallel with the electrostatic capacitive coupling antenna 8a. Further, a circuit is provided to ground the connection point of the inductive coupling antennas 1a and 1b via a variable-impedance load 17b.

Figure 18:
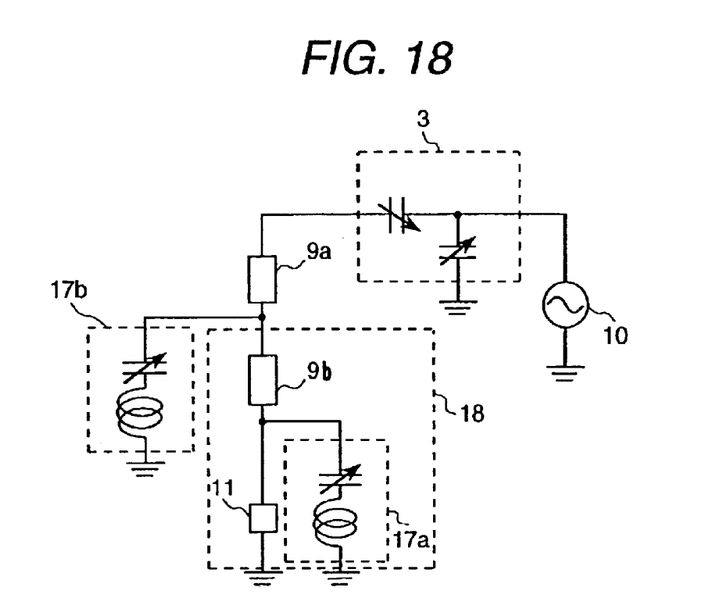
FIG. 18 is an equivalent circuit diagram of the discharging circuit of FIG. 17.

FIG. 18 shows a circuit equivalent to the discharging circuit of FIG. 17. This circuit represents the inductive coupling antenna 1a as load 9a, the inductive coupling antenna 1b as load 9b, and the electrostatic capacitive coupling antenna 8a as load 11. In this embodiment, the magnitude of the inductive coupling discharge is controlled by the magnitude of the load 17a. As the impedance of the load 17a increases, the current flowing through the load 11 increases. Consequently, the ratio of plasma generated by the electrostatic capacitive coupling discharge becomes greater.

Further, the load 17b is connected in parallel with a series connection of loads 9b and 11. Therefore, the inductive coupling discharge produced by the inductive coupling antenna 1b and the electrostatic capacitive coupling discharge produced by the electrostatic capacitive coupling antenna 8a can be controlled by regulating the impedance of the load 17b.

For impedance matching, it is preferable that the reactance of the load 17a should be negative to avoid parallel resonance because the reactance of the impedance of the electrostatic capacitive coupling antenna 8a is negative. Similarly, to prevent a parallel resonance with the circuit connected in parallel with the load 17b, it is preferable to make the reactance of the load 17b positive when the combined reactance of the loads 9b, 11, and 17a is positive or to make the reactance of the load 17b negative when the combined reactance is negative. If the reactance of the load of the whole discharging circuit to be impedance-matched is negative and the inverted-L-type matching box 3 is disabled, an inductor should be inserted in series with the load 9a to enable impedance matching.

Therefore, the same effects as those of the first through third embodiments can be obtained.

Figure 19:
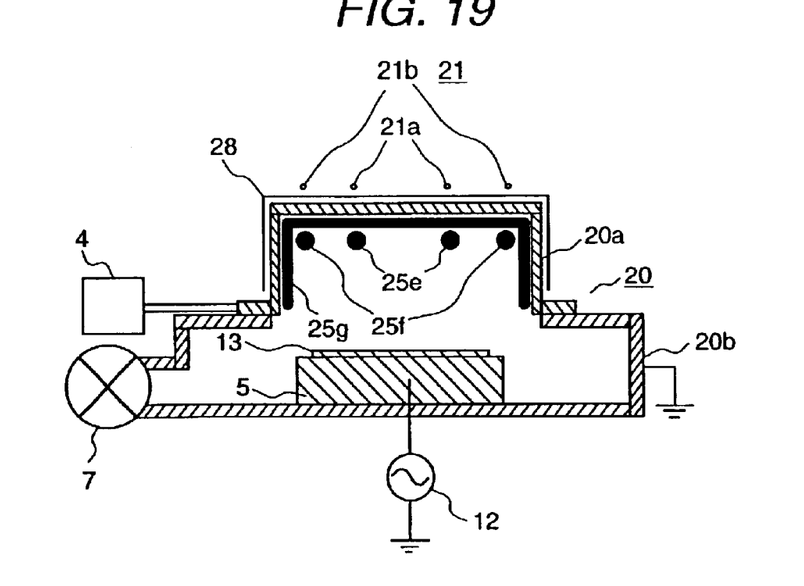
FIG. 19 is a sectional view of a plasma processing apparatus which represents a sixth preferred embodiment of the present invention.
Figure 20:
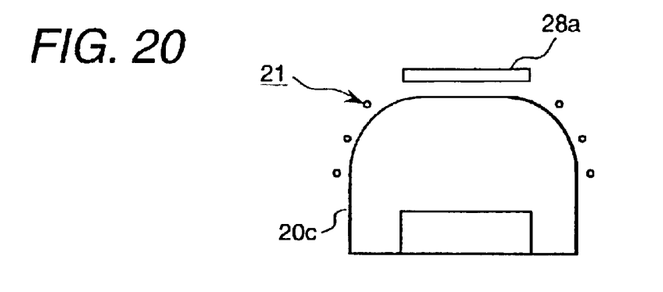
FIG. 20 is a sectional view of a plasma processing apparatus which represents another embodiment of the present invention.
Figure 21:
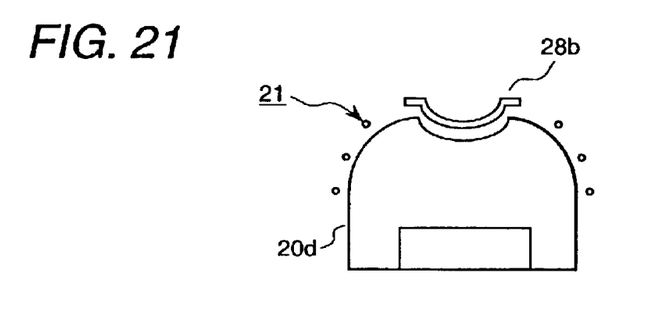
FIG. 21 is a sectional view of a plasma processing apparatus which represents another embodiment of the present invention.

A sixth embodiment of the present invention will be described in detail with reference to FIG. 19. FIG. 19 is a sectional view of the plasma processing apparatus of the present invention. The basic concept of this embodiment is the same as that of the first through third embodiments, but the discharging section 20a of the vacuum chamber 20 and the antennas (21 and 28) have different shapes. In this embodiment, the discharging section 20a is cylindrical and the cylindrical electrostatic capacitive coupling antenna 28 wholly covers the cylindrical discharging section 20a. Two inductive coupling antenna coils 21a and 21b are provided on the ceiling of the discharging section 20a.

In this embodiment, the two inductive coupling antenna coils 21a and 21b produce strong electric fields in areas 25e and 25f and the electrostatic capacitive coupling antenna 28 produces a strong electric field in area 25g. These strong electric fields produce plasma. Since the cylindrical electrostatic capacitive coupling antenna 28 covers the whole cylindrical discharging section 20a, the electric field in area 25g covers the inner wall of the discharging section 20a. Therefore, the electrostatic capacitive coupling discharge can prevent the deposition of byproducts on the inner wall of the discharging section 20a or clean deposits from the inner wall.

Further, the inductive coupling antenna 21a on the ceiling of the discharging section 20a is smaller in diameter than the inductive coupling antenna 21b. Consequently, the plasma produced by the inductive coupling antenna 21a is strongest in the center and the plasma produced by the inductive coupling antenna 21b is strongest in the circumferential area. This embodiment can produce the same effect as that of the other embodiments by using any of their discharging circuits.

As aforesaid, the plasma processing apparatus in accordance with the present invention controls the ratio of high-frequency currents which flow in the inductive coupling antenna(s) and the electrostatic capacitive coupling antenna. The plasma processing apparatus can also control the ratio of electrostatic capacitive coupling discharge and inductive coupling discharge by changing the impedances of the load 17 and the variable capacitor 16 in the discharging circuit. This can suppress deposition of byproducts on the inner wall of the vacuum chamber during plasma processing. This plasma processing apparatus can also control the distribution of plasma, which enables uniform and various plasma processing, such as etching by plasma.

The present invention is not limited to the aforesaid first through sixth embodiments. The discharging circuit of the plasma processing apparatus can be built up with a combination of these embodiments. The vacuum chamber need not be divided into two sections (a discharging section and a processing section) and the shape of the discharging section is not limited to those examples provided in the embodiments.

Figure 22:
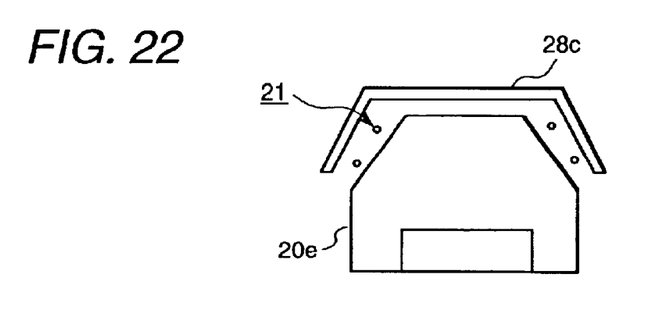
FIG. 22 is a sectional view of a plasma processing apparatus which represents another embodiment of the present invention.
Figure 23:
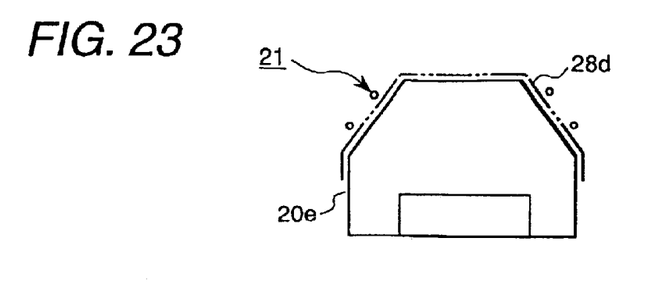
FIG. 23 is a sectional view of a plasma processing apparatus which represents another embodiment of the present invention.

For example, the vacuum chamber can be shaped as shown in FIG. 20 through FIG. 23. Further, the electrostatic capacitive coupling antenna can be located outside the inductive coupling antenna as shown in FIG. 22, attached to the outer surface of the vacuum chamber, or embedded in the vacuum chamber.

The reference numerals 20c, 20d, and 20e denote vacuum chambers and at least their parts opposite to the antennas are made of non-conductive material. Reference numeral 21 denotes an inductive coupling antenna. Reference numerals 28a, 28b, 28c, and 28d denote electrostatic capacitive coupling antennas.

The present invention is applicable to apparatuses for and methods of using plasma (e.g. etching, CVD, sputtering, etc.) and can process various materials such as semiconductor wafers, liquid crystal display substrates, magnetic heads, etc., to the extent that they can be processed by plasma.

Figure 24:
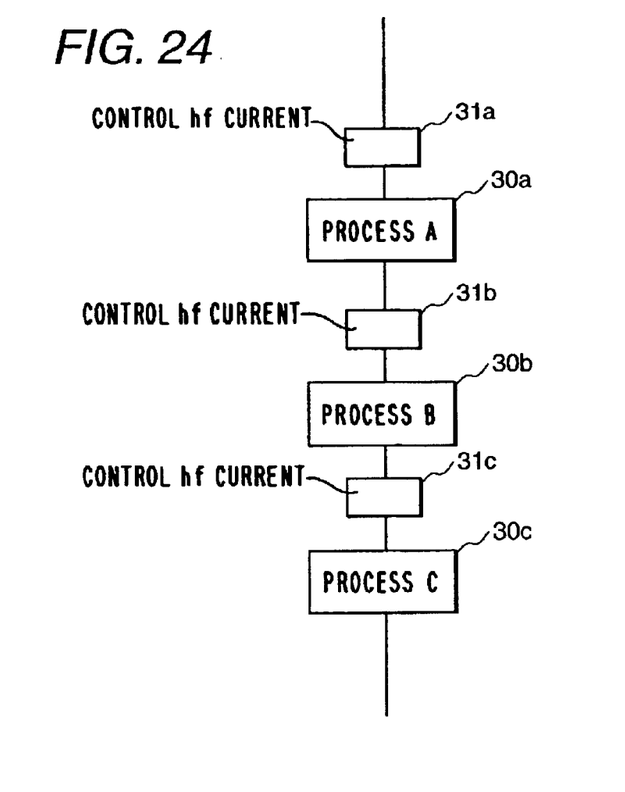
FIG. 24 is a flow diagram which shows an example of a semiconductor processing flow in accordance with the present invention.

Further, the present invention can be applied to semiconductor manufacturing processes of the type illustrated in FIG. 24, which shows one semiconductor processing example using the present invention. This process uses one of the plasma processing apparatuses of the aforesaid embodiments.

In the semiconductor processes, a process recipe is determined to process wafers uniformly (for etching or layer formation) by selecting and controlling the kinds of process (etching) gases, gas pressures in the vacuum chamber, gas flow rates, high-frequency power to be applied to the antennas, etc. To etch aluminum substrates, for example, a chlorine or boron trichloride gas is used. To etch silica substrates, $C_4F_8$ gas is used as a process gas.

To etch the aforesaid materials by a conventional plasma processing method, different kinds of apparatuses are required because the distribution of plasma varies if the kind of gas or the pressure changes.

However, the plasma processing apparatus in accordance with the present invention can process two kinds of wafers with a fixed uniform plasma distribution in each process just by adding processes 31a, 31b, and 31c for controlling high-frequency currents which flow through the inductive coupling antennas to control the plasma distribution and by placing process 30a after process 31a, process 30b after process 31b, and process 30c after process 31c.

This eliminates the steps required to transfer wafers between one plasma processing apparatus and another, and increases the throughput. Further, as the plasma processing apparatus in accordance with the present invention can perform a plurality of processes, no extra device is required.

What is claimed is:

1. A plasma processing apparatus comprising:
a vacuum chamber including a discharging section, the discharging section being made of a non-conductive material and forming a plasma generating space;
an inductive coupling antenna wound around the discharging section;
an electrostatic capacitive coupling antenna disposed above the discharging section;
a variable-impedance circuit electrically connected in parallel with the electrostatic capacitive coupling antenna; and
a high-frequency power source which applies high-frequency power to the inductive coupling antenna;
wherein the electrostatic capacitive coupling antenna is connected in series through the inductive coupling antenna to the high-frequency power source.

2. A plasma processing apparatus comprising:
a vacuum chamber including a discharging section, the discharging section being made of a non-conductive material and forming a plasma generating space;
an electrode which supports a specimen to be processed, the electrode being disposed in the vacuum chamber and having a bias voltage applied thereto;
an inductive coupling antenna wound around the discharging section;
an electrostatic capacitive coupling antenna disposed above the discharging section;
a variable-impedance circuit electrically connected to ground in parallel with the electrostatic capacitive coupling antenna; and
a high-frequency power source which applies high-frequency power to the inductive coupling antenna;
wherein the electrostatic capacitive coupling antenna is connected in series through the inductive coupling antenna to the high-frequency power source.

3. A plasma processing apparatus comprising:
a vacuum chamber including a discharging section, the discharging section being made of a non-conductive material and forming a plasma generating space;
an inductive coupling antenna disposed outside the discharging section;
an electrostatic capacitive coupling antenna attached to an outer surface of the discharging section;
a circuit electrically connected in parallel with the electrostatic capacitive coupling antenna; and
a high-frequency power source which applies high-frequency power to the inductive coupling antenna;
wherein the electrostatic capacitive coupling antenna is connected in series through the inductive coupling antenna to the high-frequency power source.

4. A plasma processing apparatus comprising:
a vacuum chamber Including a discharging section, the discharging section being made of a non-conductive material and forming a plasma generating space;
an inductive coupling antenna disposed outside the discharging section;
an electrostatic capacitive coupling antenna embedded in the discharging section;
a circuit electrically connected in parallel with the electrostatic capacitive coupling antenna; and
a high-frequency power source which applies high-frequency power to the inductive coupling antenna;
wherein the electrostatic capacitive coupling antenna is connected in series through the inductive coupling antenna to the high-frequency power source.

* * * * *